(12) United States Patent
Chang

(10) Patent No.: US 6,385,122 B1
(45) Date of Patent: May 7, 2002

(54) ROW AND COLUMN ACCESSIBLE MEMORY WITH A BUILT-IN MULTIPLEX

(75) Inventor: Houn Chang, San Jose, CA (US)

(73) Assignee: Virage Logic Corp., Freemont, CA (US)

( * ) Notice: Subject to any disclaimer, the term of this patent is extended or adjusted under 35 U.S.C. 154(b) by 0 days.

(21) Appl. No.: 09/773,319

(22) Filed: Jan. 31, 2001

(51) Int. Cl.[7] .................................................. G11C 8/00
(52) U.S. Cl. ........................... 365/230.05; 365/230.08; 365/233
(58) Field of Search ..................... 365/230.05, 189.01, 365/230.08, 233

(56) References Cited

U.S. PATENT DOCUMENTS

| | | | | |
|---|---|---|---|---|
| 5,260,908 A | * | 11/1993 | Ueno ..................... | 365/230.05 |
| 5,317,540 A | * | 5/1994 | Furuyama .................. | 365/238 |
| 5,477,489 A | * | 12/1995 | Wiedmann ............. | 365/189.04 |
| 5,561,638 A | * | 10/1996 | Gibson et al. ......... | 365/230.05 |
| 5,959,931 A | * | 9/1999 | Ueda ..................... | 365/230.05 |

* cited by examiner

*Primary Examiner*—Son T. Dinh
(74) *Attorney, Agent, or Firm*—Smith, Danamraj & Youst, P.C.

(57) ABSTRACT

A row and column accessible memory having a plurality of memory cells organized as an array of N rows and N columns with a built-in multiplex. A control logic block and decoder block are operable to effectuate either a row access operation for accessing a selected row or a column access operation for accessing a selected column based on a plurality of address signals supplied to the memory. Each memory cell is provided with a first pair of read and write ports for effectuating the row access operations (controlled through row read wordline select and row write wordline select signals, respectively) and a second pair of read and write ports for effectuating the column access operations (controlled through column read wordline select and column write wordline select signals, respectively). A single I/O block is utilized for sensing and data I/O operations, which requires less silicon area and avoids extra routing required in the conventional solutions.

17 Claims, 8 Drawing Sheets

ROW AND COLUMN ACCESSIBLE MEMORY WITH A BUILT-IN MULTIPLEX

BACKGROUND OF THE INVENTION

1. Technical Field of the Invention

The present invention relates generally to semiconductor memories, and more particularly, to a row and column accessible memory circuit with a built-in multiplex.

2. Description of Related Art

Memory circuits organized as an array of rows and columns are typically accessed by using what is known as a row access operation. Essentially, a row address is supplied to the memory circuit and, based on the address information, a particular row or wordline is driven high. Depending on whether a read cycle or write cycle is involved, input data provided via an input/output (I/O) block is stored at the memory locations disposed on the selected row or the data stored thereat is read therefrom.

Row accessible memory such as set forth above is well known in the memory design art and is advantageous in many applications. However, there are certain situations where the conventional row accessible memory solutions are less than satisfactory. For example, if the memory locations comprising a particular column or bitline are to be accessed, the array needs to be accessed a number of times on per row basis depending upon the number of memory cells in the bitline. For arrays of even modest size, such a requirement can pose a significant limitation in terms of additional access cycles, thereby compromising the memory circuit's performance.

Column accessible memory solutions are available for applications requiring special functionality such as memory access on a per column basis. Although the conventional column accessible memory circuits are an improvement over the row accessible memories, several shortcomings and deficiencies remain. First, a separate I/O block is typically required for effectuating column access operations. When a column address is provided, a control signal operable with a logic block is utilized to generate a select signal for a particular column. The read/write bitlines associated with the selected column are coupled to a column I/O block that is different from the row I/O block used for the typical row access operations. Moreover, because common data-in and dataout lines are employed for the row and column access operations (in order to minimize the I/O bus), an external multiplexer circuit is required to select between the data paths operable with the row accesses and the data paths operable with the column accesses. It should be appreciated, accordingly, that the conventional column accessible memories require expensive additional silicon area for the extra circuitry. Furthermore, because of the layout considerations arising out of the extra blocks, routing issues become prominent as well.

Based on the foregoing, it should be apparent to those skilled in the art that there has arisen an acute need for an effective and efficient memory solution (especially for applications requiring special functionality, for example, telecommunications network elements such as routers, switches, and the like) that allows both row and column access operations while improving performance and silicon area utilization.

SUMMARY OF THE INVENTION

Accordingly, the present invention is directed to a row and column accessible memory having a plurality of memory cells organized as an array of N rows and N columns, wherein the column accessible functionality is achieved without separate column I/O block circuitry, multiplexer circuitry and associated metal routing.

A control logic block and decoder block are operable to effectuate either a row access operation for accessing a selected row or a column access operation for accessing a selected column based on a plurality of address signals supplied to the memory. Each memory cell is provided with a first pair of read and write ports for effectuating the row access operations (controlled through a pair of row read wordline select and row write wordline select signals, respectively) and a second pair of read and write ports for effectuating the column access operation (controlled through a pair of column read wordline select and column write wordline select signals, respectively). A single I/O block is utilized for sensing and data I/O operations in the row and column access modes because the row read bitlines (i.e., the row read ports) are coupled to the column read bitlines (i.e., the column read ports) and the row write bitlines (i.e., the row write ports) are coupled to the column write bitlines (i.e., the column write ports) in the memory cells placed in one of the two diagonals of the array.

When a row address is provided, row access control signals (i.e., row read wordline select and row write wordline select signals) are generated, which effectuate the row access operation with respect to a particular row based on the supplied address. That is, in the row access operation, the memory circuit behaves like a conventional row accessible memory. When a column address is supplied, only column access control signals (i.e., column read wordline select and column write wordline select signals) are generated. Since the column read bitlines and row read bitlines are commonly coupled in the diagonal cells (hereinafter referred to as the "programmed" cells (P-cells) or "special memory cells"), the memory cells in the accessed column generate data on the row read bitlines corresponding to the diagonal cells, similar to a conventional row access operation.

In another aspect, the present invention is directed to a special memory cell (i.e., P-cell) structure for use in a row and column accessible memory device, wherein a plurality of such P-cells form a diagonal portion of an array associated with the memory device. Each P-cell comprises a first pair of read and write ports operable with respect to a row access operation and a second pair of read and write ports operable with respect to a column access operation in response to an access control signal. A pair of inverters are coupled to each other to form a first data node and a second data node for storing complementary binary data thereat in the P-cell. A row write transistor is coupled to the first data node wherein the row write transistor is operable to provide a data value available at the first write port to the first data node when activated by a row write wordline select signal generated by a decoder circuit. A row read transistor is coupled to the second data node wherein the row read transistor is operable to provide a data value available at the second data node to the first read port when activated by a row read wordline select signal generated by the decoder circuit.

To effectuate column access operations, a column write transistor is coupled to the first data node wherein the column write transistor is operable to provide a data value available at the second write port to the first data node when activated by a column write wordline select signal generated by the decoder circuit of the row and column accessible memory device. In similar manner, a column read transistor is coupled to the second data node wherein the column read transistor is operable to provide a data value available at the second data node to the second read port when activated by a column read wordline select signal generated by the decoder circuit. Further, for each P-cell placed in one of the two diagonal portions of the array, the first and second write ports are tied together at a common write node and the first and second read ports are tied together at a common read node. This arrangement allows the use of a single I/O block for both row and column access operations.

In a further aspect, the present invention is directed to a memory read operation in a row and column accessible memory array organized as N rows by N columns. A clock signal and an access control signal are asserted to initiate a memory read cycle in a row access operation or a column access operation based on a plurality of address signals supplied to a control block coupled to the memory array. If the row access operation is specified, a row read wordline select signal is generated for a selected row of the memory array. Thereafter, a data voltage is developed as a row read bitline signal associated with a particular memory cell disposed on the selected row in response to the row read wordline select signal. Data on the row read bitline signal is sensed in an I/O block coupled to the memory array, which is then read on an appropriate data output line associated with the I/O block.

If the column access operation is specified, a column read wordline select signal is generated for a selected column of the memory array. A column read bitline signal is then developed for a particular memory cell disposed on the selected column in response to the column read wordline select signal. Data on the column read bitline signal is sensed in the I/O block for outputting the data on an appropriate data output line associated therewith.

In a still further aspect, the present invention is directed to a memory write operation in a row and column accessible memory array organized as N rows by N columns. Similar to the memory read operation summarized above, a clock signal and an access control signal are asserted to initiate a memory write cycle in one of a row access operation and a column access operation based on a plurality of address signals supplied to a control block coupled to the memory array. If the row access operation is specified, a row write wordline select signal is generated for a selected row of the memory array. A row write bitline signal is generated for a particular memory cell disposed on the selected row in response to a data value available via a data input line through an I/O block of the memory array. The data value associated with the row write bitline signal is then stored at a data node in the particular memory cell. If the column access operation is specified, a column write wordline select signal is generated for a selected column of the memory array. Thereafter, a data value available via a data input line through the I/O block is transferred to a column write bitline signal associated with a particular memory cell. Subsequently, the data value on the column write bitline signal is stored at a data node in the particular memory cell in the selected column.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
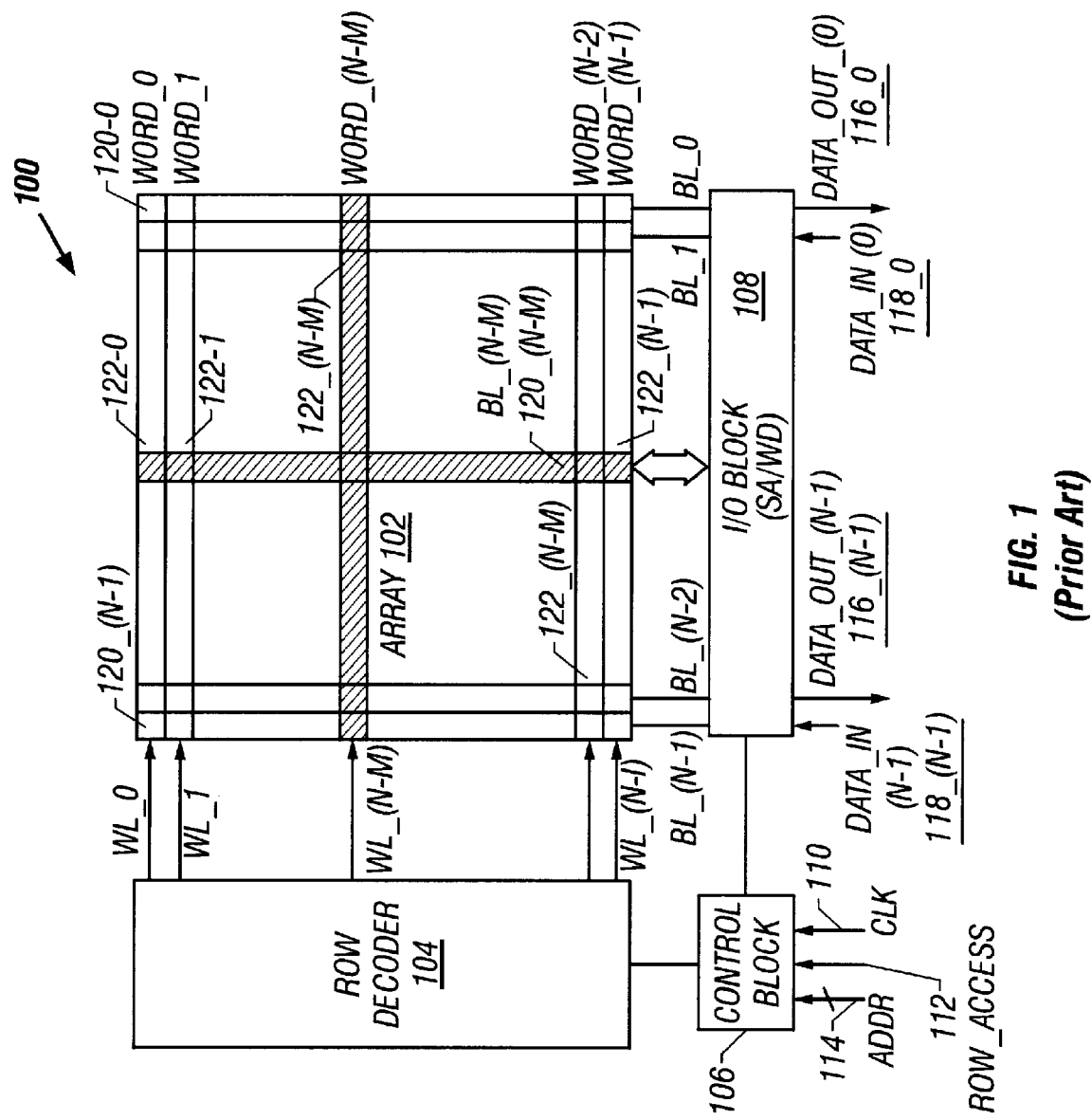
FIG. 1 (Prior Art) depicts a conventional row accessible memory.

In the drawings, like or similar elements are designated with identical reference numerals throughout the several views thereof, and the various elements depicted are not necessarily drawn to scale. Referring now to FIG. 1, depicted therein is an architectural view of a conventional row accessible memory circuit 100 having a plurality of memory cells (e.g., SRAM, DRAM, et cetera) organized into an array 102 with N rows and N columns. In the exemplary embodiment of the conventional memory circuit 100, WORD_0 (reference numeral 122_0) through WORD_(N-1) (reference numeral 122_(N-1)) exemplify N rows of the array 102. In similar fashion, BL_0 (reference numeral 120_0) through BL_(N-1) (reference numeral 120_(N-1)) refer to N columns of the array 102.

A control logic block 106 operable with a clock (CLK) 110, a ROW_ACCESS control signal 112, and a plurality of address signals 114 is conventionally provided in the memory circuit 100 for generating appropriate pre-decoded or partially-decoded address signals towards a row decoder block 104 and for generating suitable control signals towards an input/output (I/O) block 108. The I/O block 108 is typically comprised of appropriate sense amp (SA) and write driver (WD) circuitry for effectuating data I/O operations in a conventional manner.

A plurality of data input and data output lines are coupled to the I/O block 108 whereby the data is presented to the memory circuit 100 for a write operation or the stored data is read therefrom. In the exemplary embodiment of the memory circuit 100, DATA_IN_0 (reference numeral 118_0) through DATA_IN_(N-1) (reference numeral 118_(N-1)) refer to N data input lines and, in similar fashion, DATA_OUT_0 (reference numeral 116_0) through DATA_OUT_(N-1) (reference numeral 116_(N-1)) refer to N data output lines.

For a given row address on the address signals 114, the decoder 104 generates a row select signal (WL_0 through WL_(N-1)) which selects a particular row in the array 102 for a read or write operation. For example, when a select row address is provided, WL_(N-M) is generated by the row decoder 104 for accessing the row labeled as WORD_(N-M) (reference numeral 122_(N-M)) for storing input data on DATA_IN[(N-1):0] thereat or reading the stored data on DATA_OUT[(N-1):0].

As pointed out in the Background section of the present patent application, using the conventional row access method for reading from or writing to a particular bitline, e.g., BL_(N-M) (reference numeral 120_(N-M)), requires accessing the array 102 N times, which necessitates additional cycle time. Accordingly, a column accessible memory is typically provided for obviating such need.

Figure 2:
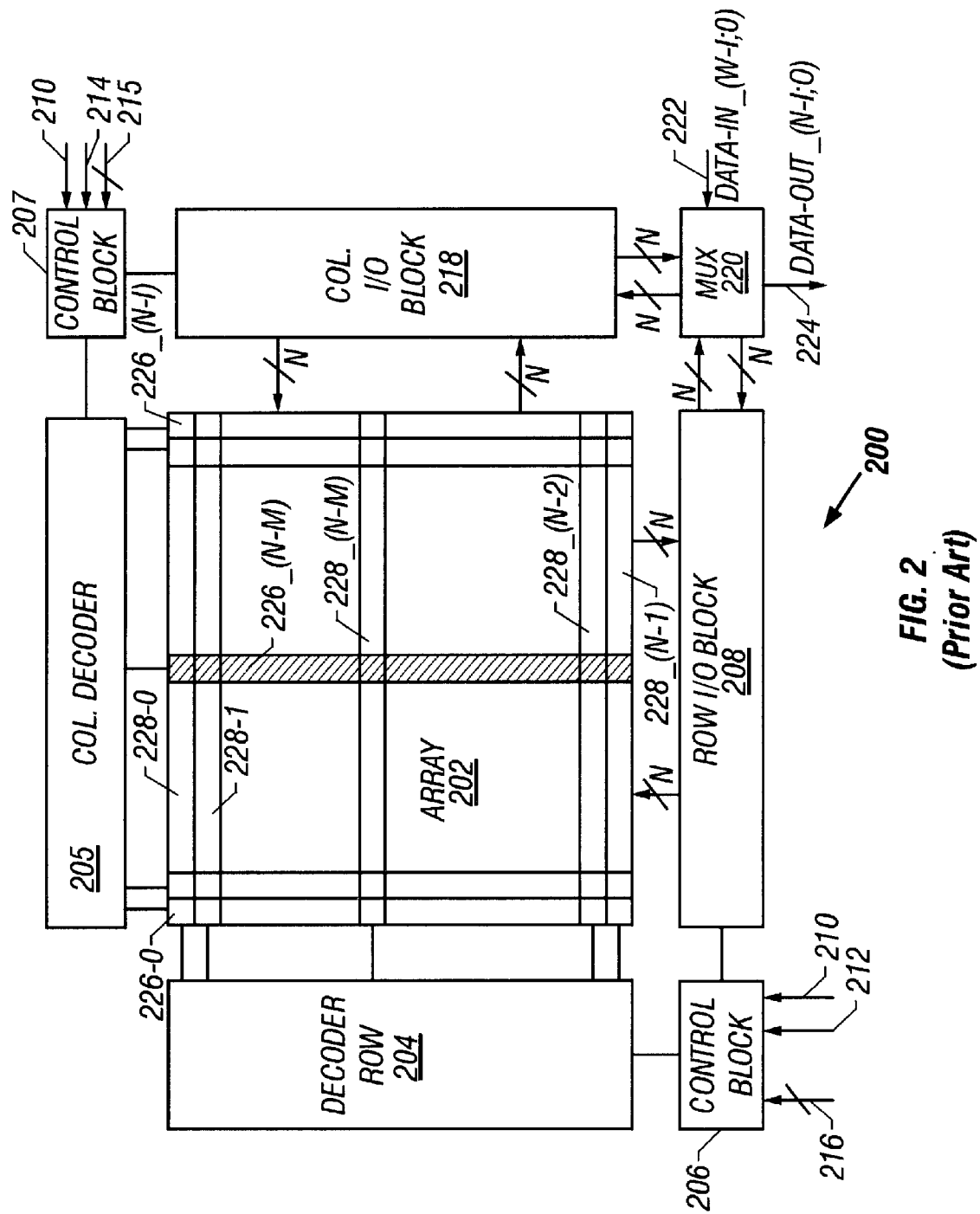
FIG. 2 (Prior Art) depicts a conventional column accessible memory.

Referring now to FIG. 2, depicted therein is an architectural view of a conventional column accessible memory circuit 200 that allows accessing an N by N memory array 202 on a per column basis. In the exemplary embodiment of the column accessible memory circuit 200, reference numerals 226_0 through 226_(N-1) refer to N column words or COL_WORDs and reference numerals 228_0 through 228_(N-1) refer to N row words or ROW_WORDs. A control logic block 206 operable with a CLK 210, a ROW_ACCESS control signal 212, and a plurality of address signals 216 is coupled to a row decoder block 204 to select a particular row depending upon the row address provided and appropriate ACCESS control signal. In similar fashion, a column control block 207 is operable with CLK 210, address signals 215 and a COL_ACCESS control signal 214 for providing appropriate signals to a column decoder block 205 in order to select a particular column word.

Separate row and column I/O blocks (reference numerals 208 and 218, respectively) are provided in the conventional column accessible memory circuit 200 for effectuating a row access operation or a column access operation. Also, a multiplexer (MUX) block 220 is operably coupled to the row and column I/O blocks 208, 218 for multiplexing DATA_IN[(N-1):0)] (reference numeral 222) for data input operations and DATA_OUT[(N-1):0)] (reference numeral 224) for data output operations with respect to the row and column accesses. In other words, when a row access operation is effectuated due in part to the ROW_ACCESS control signal 212, a particular row (e.g., ROW_WORD 228_(N-M)) is selected in the conventional manner and the data is either written to or read out from the selected row using the row I/O block 208 and MUX 220. On the other hand, when the column access operation is effectuated similarly due to the COL_ACCESS control signal 214, a particular column (e.g, COL_WORD 226_(N-M)) is selected by the column decoder 205. The data is then either written to or read out from the selected COL_WORD using the column I/O block 218 and MUX 220.

Whereas the conventional column accessible memory is advantageous for certain memory applications, it should be appreciated that due to the requirement of a separate column I/O block and associated decoding and multiplexing circuitry, additional silicon area is required in comparison to the conventional row accessible memories. Furthermore, as alluded to in the Background section, these extra circuit blocks in the conventional column accessible memory necessitate supplemental metal routing, which can be prone to defects during memory fabrication.

Figure 3:
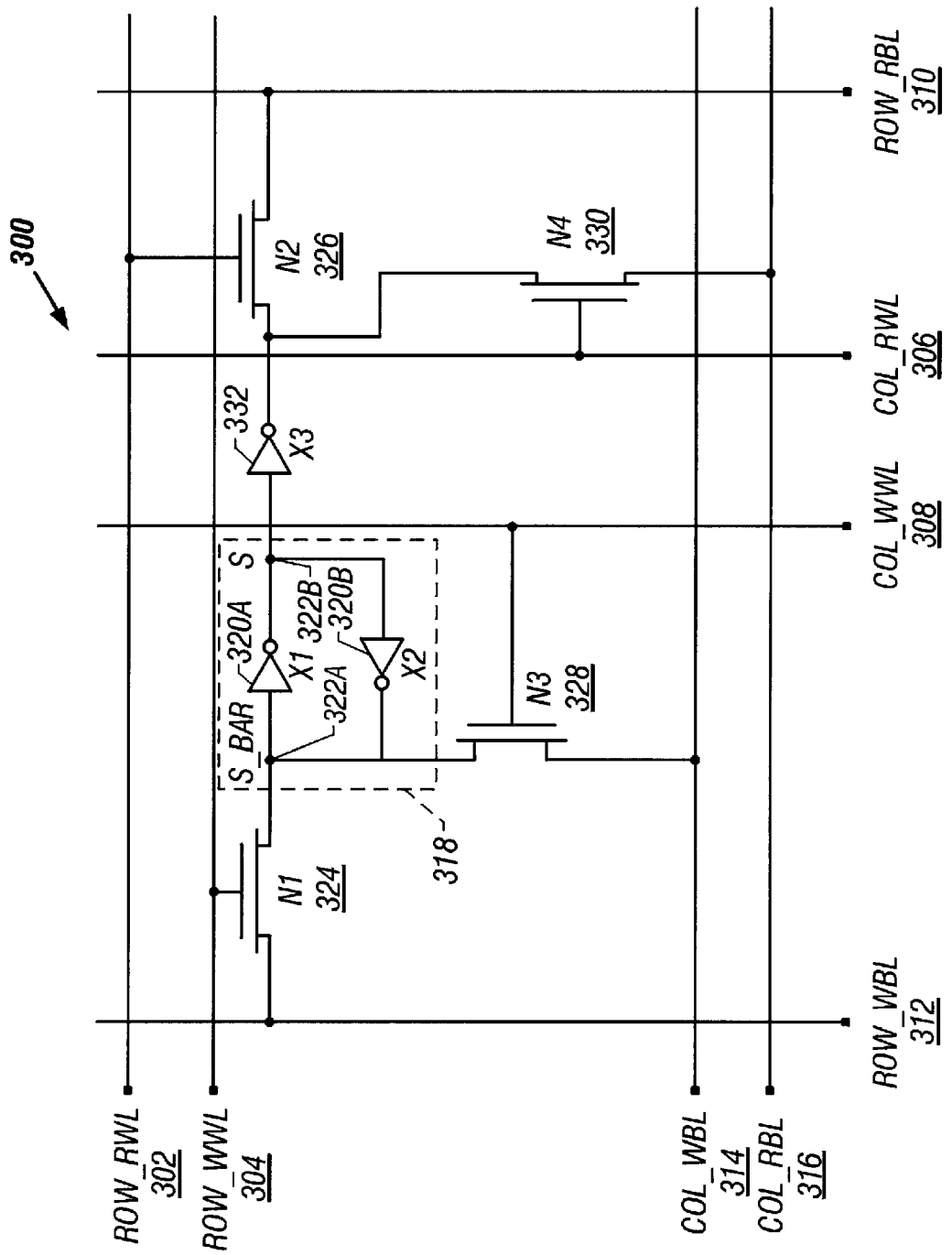
FIG. 3 depicts an exemplary core cell for use in a row and column accessible memory provided in accordance with the teachings of the present invention.

FIG. 3 depicts an exemplary core cell 300 for use in a row and column accessible memory provided in accordance with the teachings of the present invention. In the presently preferred exemplary embodiment of the present invention, the core cell 300 is comprised of an SRAM-based storage element 318 having two data nodes, a first data node 322A and a second data node 322B, formed from a pair of inverters X1 (reference numeral 320A) and X2 (reference numeral 320B) coupled to each other. Those skilled in the art should readily appreciate that the inverter pair is operable as a cross-coupled inverter latch and the data node pair is operable to store complementary binary data thereat. The data nodes, therefore, may be labeled as S and S_BAR nodes analogous to the conventional treatment in the memory design art.

A first pair of read and write ports and a second pair of read and write ports are associated with the core memory cell 300 for effectuating row access operations and column access respectively, in accordance with the teachings of the present invention. In FIG. 3, the read/write ports for the row access operations are labeled as row read bitline (ROW_RBL) 310 and row write bitline (ROW_WBL) 312, respectively. For the sake of simplicity, these two bitlines may be cumulatively referred to as ROW_BL. In similar fashion, the read/write ports associated with the column access operations which are labeled as column read bitline (COL_RBL) 316 and column write bitline (COL_WBL) 314, respectively, may be cumulatively referred to as COl_BL.

Each of the ports in the core cell 300 is controlled by a corresponding control signal (referred to as a wordline select signal) generated by a suitable row/column decoder (not shown in this FIG.), depending on whether a row or column access operation is effectuated and whether a read or a write cycle is involved. Accordingly, four wordline select signals are provided: a row read wordline select signal (ROW_RWL) 302 and a row write wordline select signal (ROW_WWL) 304 for controlling read and write ports 310, 312 during a row access operation; and a column read wordline select signal (COL_RWL) 306 and a column write wordline select signal (COL_WWL) 308 for controlling read and write ports 316, 314 during a column access operation.

When a row address is supplied for a row access operation, a ROW_ACCESS control signal is generated in a suitable logic block. Responsive to the ROW_ACCESS and address signals, in addition to a signal indicating whether a read or write cycle is involved, either ROW_RWL 302 or ROW_WWL 304 of a particular ROW_WORD is driven high. If a write operation is indicated, ROW_WWL is pulled high which activates a row write transistor (N1) 324 coupled to the data node 322A. Accordingly, input data available at the write port ROW_WBL 312 is then transferred via the activated N1 device and stored at the data node 322A, its complementary data being provided to the other data node 322B through inverter 320A.

When a row read operation is indicated, ROW_RWL is driven high which activates a row read transistor (N2) 326 coupled to the data node 322B via an inverter (X3) 332. Accordingly, data stored at node 322B is transferred via the activated N2 device to the read port ROW_RBL 310, which can thereafter be sensed and read out via the data output lines.

Analogously, when a column address is supplied for a column access operation, a COL_ACCESS control signal is generated in a suitable logic block. Responsive to the COL_ACCESS and address signals, in addition to a signal indicating whether a read or write cycle is involved, either COL_RWL 306 or COL_WWL 308 of a particular COL_WORD is driven high. If a write operation is indicated, COL_WWL 308 is driven high which activates a column write transistor (N3) 328 coupled to the data node 322A. Accordingly, input data available at the write port COL_WBL 314 is then transferred via the activated N3 device and stored at the data node 322A, again its complementary data being provided to the other data node 322B via inverter 320A.

When a read cycle in a column access operation is initiated, COL_RWL 306 is driven high which activates a column read transistor (N4) 326 coupled to the data node 322B via X3 332B. Accordingly, data stored at node 322B is transferred via the activated N4 device to the read port COL_RBL 316, which can thereafter be sensed and read out via the data output lines.

Figure 4:
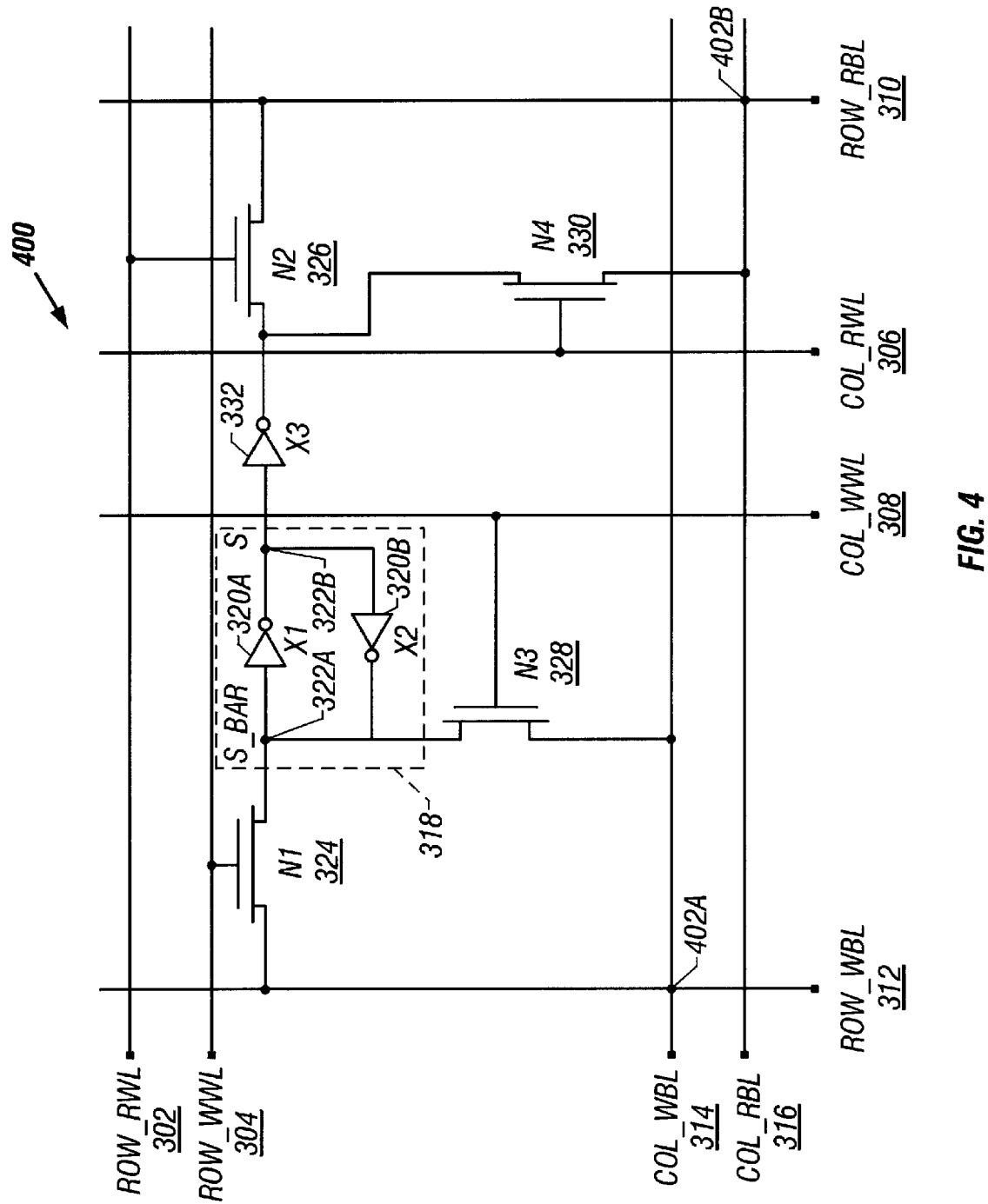
FIG. 4 depicts an exemplary P-cell for diagonal placement in an array of the row and column accessible memory of the present invention.
Figure 5A:
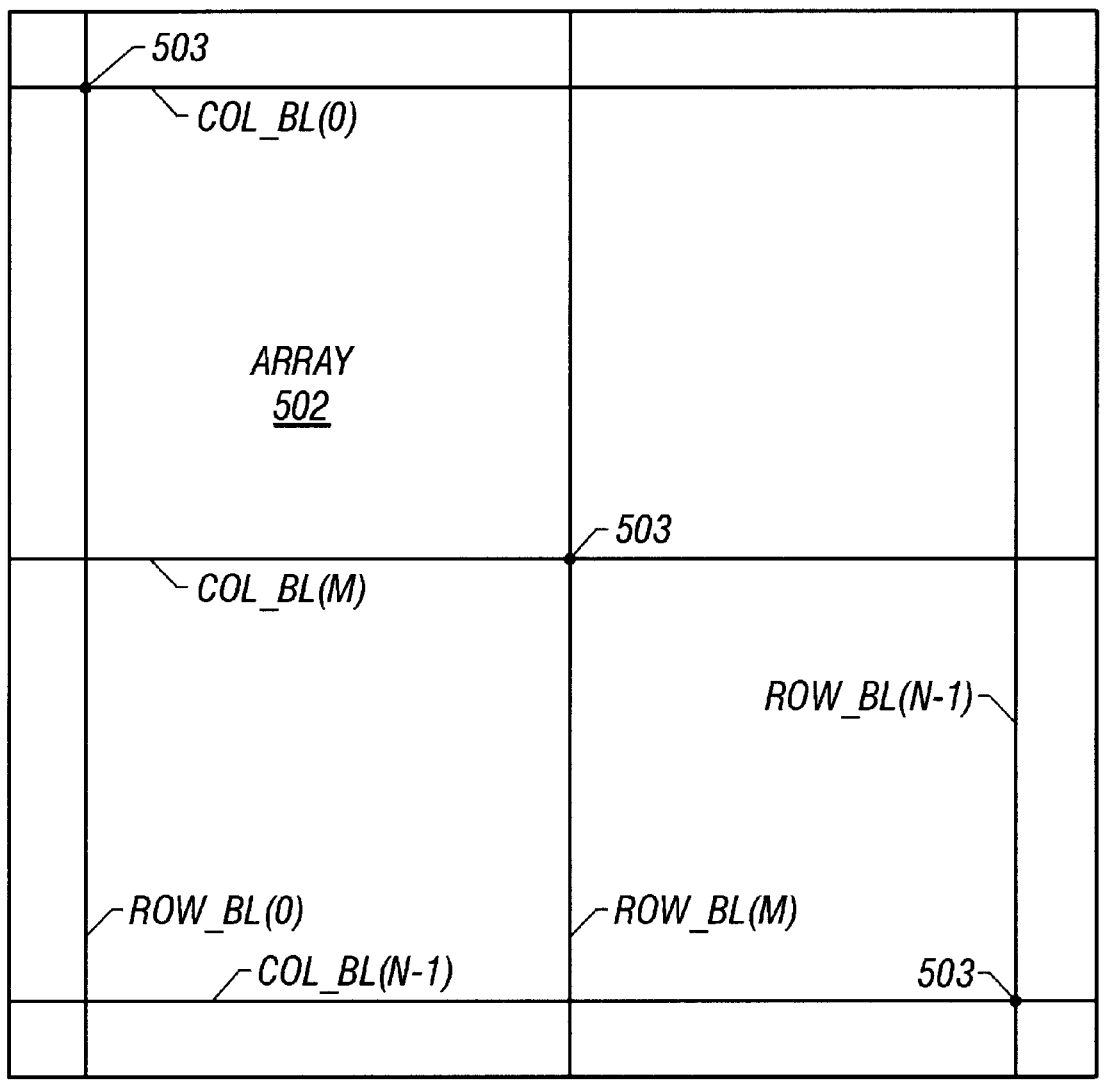
FIG. 5A depicts an exemplary embodiment of an N by N array wherein the diagonal locations are populated with the P-cells of the present invention.

In order to obviate the need for a separate column I/O block and associated MUX circuitry, the present invention advantageously provides a "programmed" cell (P-cell) or "special memory cell" that is diagonally placed in the memory array which allows for connecting the read port used for the row access operation with the read port used for the column access operation. Similarly, the P-cell is also provided with a common node for connecting the write port used for the row access operation with the write port used in the column access operation. Referring now to FIG. 4, depicted therein is an exemplary embodiment of a P-cell 400 for diagonal placement in a row and column accessible memory provided in accordance with the teachings of the present invention. It should be apparent to those skilled in the art that the structure and functionality of the exemplary P-cell 400 is essentially the same as the structure and functionality of the memory core cell 300 described in detail hereinabove. As set forth in the foregoing, however, the diagonally-placed P-cell 400 is provided with a common write node 402A that ties COL_WBL 314 and ROW_WBL 312 together and with a common read node 402B that ties COL_RBL 316 and ROW_RBL 310 together. Accordingly, by placing the P-cells 400 in one of the two diagonal portions of the array and populating the remaining locations with the core cells 300, COL_BL(N-1) is coupled to ROW_BL(N-1), COL_BL(N-2) is coupled to ROW_BL(N-2), and so on. FIG. 5A depicts an exemplary N by N array 502 wherein ROW_BL and COL_BL lines are connected at the diagonal locations 503 populated with the special memory cells of the present invention. When a row address is provided, no COl_ACCESS control signals are generated and, accordingly, only a selected ROW_WWL or ROW_RWL is driven in a manner similar to the conventional row access operation. On the other hand, when a column address is inserted, only appropriate COL_RWL or COL_WWL is driven high. Since, COL_BL for the selected COL_WORD is coupled to ROW_BL of the diagonal P-cell that is disposed on the row where the particular column cell is located, accessing that particular column cell via a column access is functionally similar to accessing that cell via ROW_BL of the P-cell in a conventional row access operation. Accordingly, only one common I/O block is necessary for sensing and data I/O with respect to both column access and row access operations.

Figure 5B:
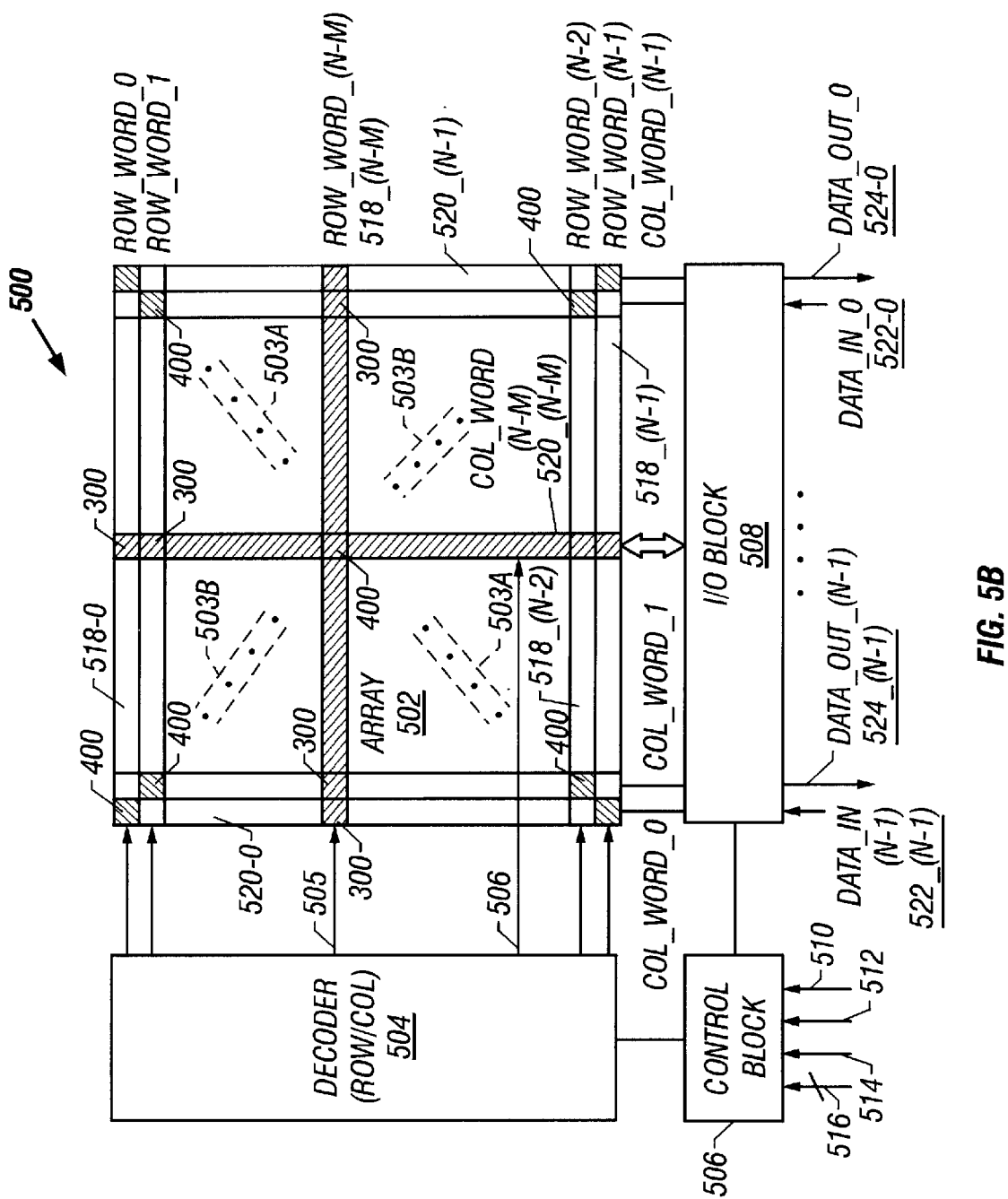
FIG. 5B depicts an exemplary embodiment of the row and column accessible memory of the present invention.

FIG. 5B depicts an exemplary embodiment of a row and column accessible memory circuit 500 provided in accordance with the teachings of the present invention. Array 502 is comprised of a plurality of core cells organized as N rows and N columns, wherein reference numerals 503A and 503B refer to the two diagonal portions thereof. Similar to the conventional column accessible memory circuit shown in FIG. 2, reference numerals 520_0 through 520_(N-1) refer to N column or vertical words (COL_WORDs) and reference numerals 518_0 through 518 (N-1) refer to N row or horizontal words (ROW_WORDs). A common control logic block 506 operable with a CLK 510, a ROW_ACCESS control signal 512, a COl_ACCESS control signal 514, and a plurality of address signals 516 is coupled to a row/column decoder block 504 to select a particular row or column depending upon the row/column address provided and appropriate ACCESS control signal. For example, horizontal wordline select signal 505 is operable to select the horizontal word labeled as ROW_WORD_(N-M) (reference numeral 518_(N-M)) for read/write operations. When a read operation is indicated, a row read wordline select signal is generated. On the other hand, a row write wordline select signal is generated when a write operation is to be effectuated. In analogous manner, vertical wordline select signal 506 is operable to select the vertical word labeled as COL_WORD_(N-M) (reference numeral 520_(N-M)) for read/write operations. Similar to the row access operations, when a column read operation is indicated, a column read wordline select signal is generated. On the other hand, a column write wordline select signal is generated when a write operation is to be effectuated. The general operation of these wordline select signals has been described in greater detail elsewhere in this patent application.

Continuing to refer to FIG. 5B, a single I/O block 508 is provided for SA circuitry and data I/O operations similar to a conventional row accessible memory circuit. A plurality of data input and data output lines are coupled to the I/O block 508 whereby the data is presented to the memory circuit 500 for storing or the stored data is read therefrom. In the exemplary embodiment of the memory circuit 500, DATA_IN_0 (reference numeral 522_0) through DATA_IN_(N-1) (reference numeral 522_(N-1)) refer to N data input lines and, in similar fashion, DATA_OUT_0 (reference numeral 524_0) through DATA_OUT_(N-1)) (reference numeral 524_(N-1)) refer to N data output lines.

The P-cells 400 may be placed either in the first diagonal portion 503A or in the second diagonal portion 503B. It should be apparent that if such P-cells are placed in both diagonal portions, bus collision may occur unless circuitry for safeguarding against such an event is also provided. As alluded to hereinabove, the memory locations not occupied by the P-cells are populated with the core cells 300.

To access a particular ROW_WORD (e.g., ROW_WORD_(N-M)) via a row access operation, appropriate row address information is provided on the address signals 516 and ROW_ACCESS control 512 is accordingly asserted. Either ROW_RWL[N-M] or ROW_WWL[N-M] is driven high, based on a read or write cycle. Similarly, either COL_RWL[N-M] or COL_WWL[N-M] is driven high in order to access COL_WORD_(N-M) in a column access operation. In either case, the same I/O block 508 is used for data I/O as is the case with a conventional row accessible memory circuit.

Figure 6:
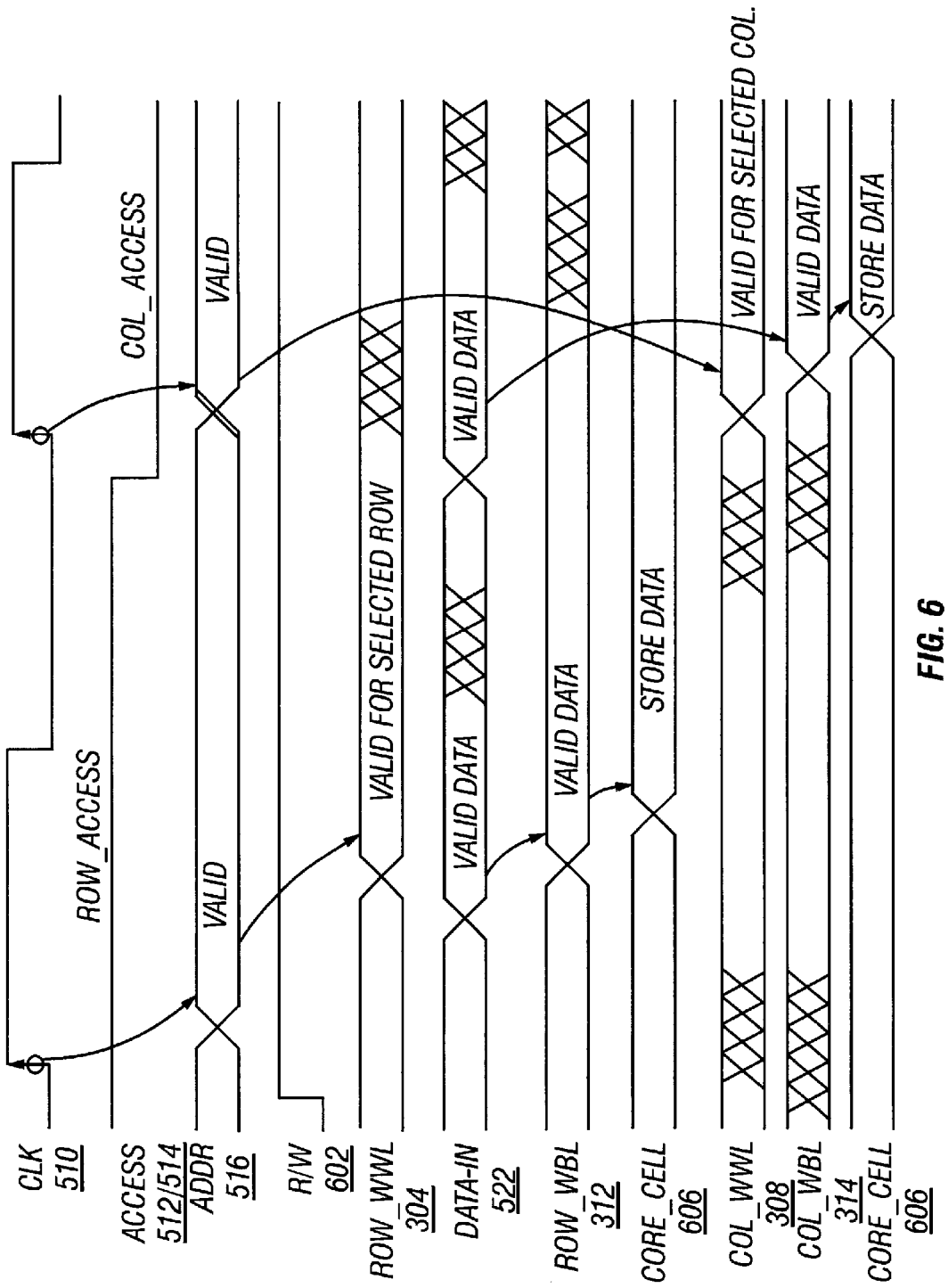
FIG. 6 is a timing diagram for an exemplary memory write operation in the row and column accessible memory of the present invention.
Figure 7:
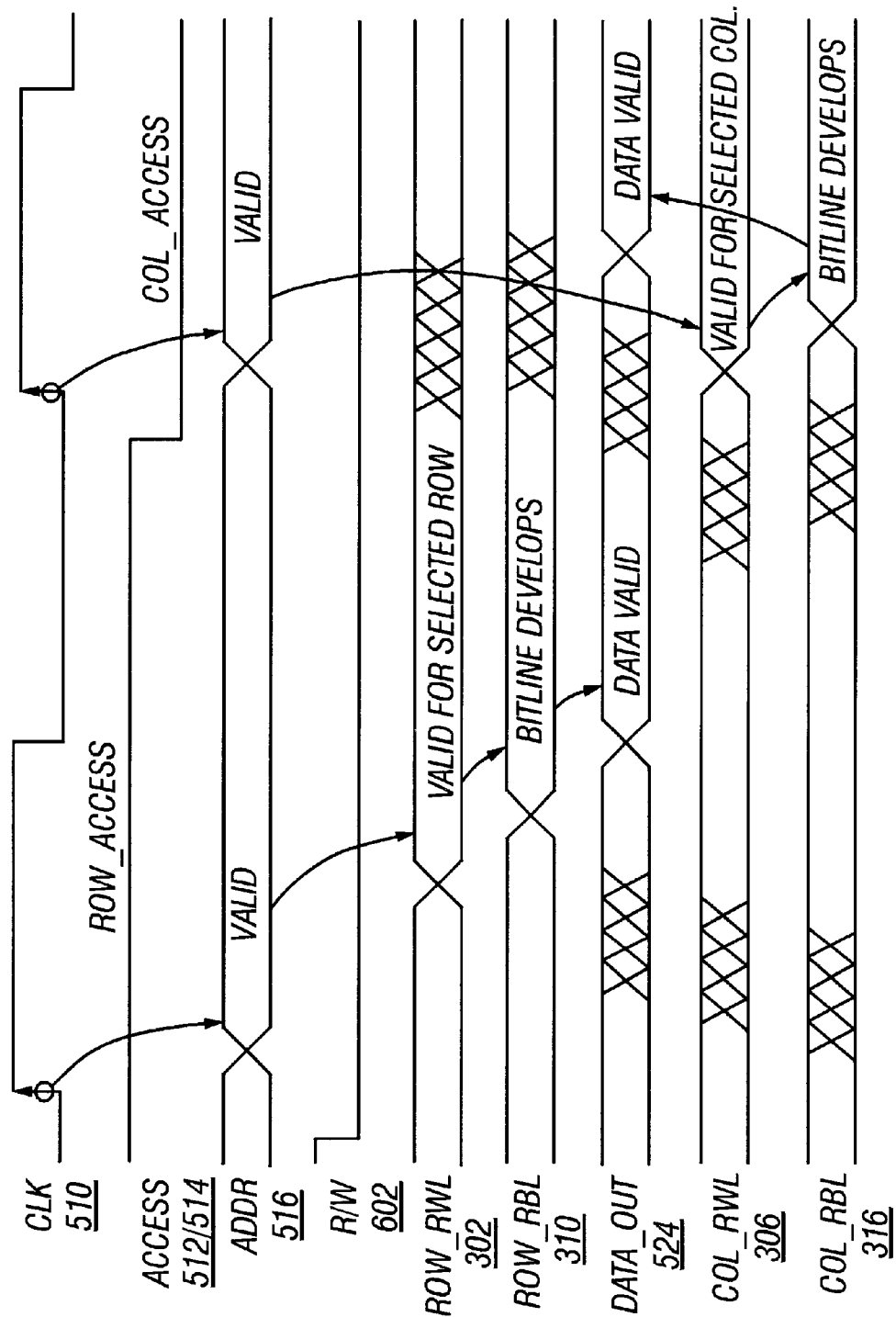
FIG. 7 is a timing diagram for an exemplary memory read operation in the row and column accessible memory of the present invention.

FIGS. 6 and 7 depict timing diagrams for an exemplary memory write operation and exemplary memory read operation, respectively, in the row and column accessible memory of the present invention. Each timing diagram includes both row and column access operations, based on the state of the ACCESS control signal. It should be apparent to one of skilled in the art that a single ACCESS control signal may be provided that can toggle between a ROW_ACCESS state and a COL_ACCESS state. Moreover, the row access operations and column access operations may be interspersed in any arrangement or sequence in the row and column accessible memory of the present device. That is, a row read operation may follow a column write operation, a column read operation may follow a row write operation, et cetera.

In specific reference to FIG. 6, a row access operation is specified by asserting ROW_ACCESS control signal. Upon asserting CLK 510, a valid row address is obtained from the address signals. By driving a read/write (R/W) signal 602 high, a write cycle is indicated. Responsive to the valid address, ROW_WWL for a selected word is driven to a valid state. In the meantime, valid DATA_IN[(N-1):0] 522 is transferred to the row write bitlines (ROW_RBL[(N-1):0]). In responsive thereto, the logic levels on the core cells (reference numeral 606) change appropriately to indicate the stored data.

A column access operation is specified by appropriately driving the ACCESS control signal. Upon asserting a rising edge in the CLK signal 510, which initiates the write cycle, a valid column address is obtained on the address signals. Responsive thereto, COL_WWL 308 of a selected column is driven high. Valid DATA_IN[(N-1):0] 522 is transferred to the column write bitlines (COL_RBL[(N-1):0]) through the ROW_RBL lines that are coupled thereto via common write nodes in the diagonally placed P-cells. Thereafter, the logic levels on the core cells (reference numeral 606) change appropriately to indicate the stored data.

Referring now to FIG. 7 in particular, two memory read cycles via the row access and column access operations are illustrated. Once again, ACCESS control signal is appropriately driven high or low to specify whether a row access or a column access is being effectuated. The R/W signal 602 is driven low to indicate a read cycle rather than a write cycle. Upon a rising edge in CLK 510, a valid row address is provided on the address signals 516. In response thereto, ROW_RWL signal 302 for a selected ROW_WORD is driven high. Appropriate logic levels are then developed on the associated ROW_RBL ports 310 and bitlines connected thereto. Upon sensing the data, it is provided on DATA_OUT lines 524.

The column access is specified by the appropriate state of the ACCESS control signal. Valid column address signals 516 generate COl_RWL signal 306 for a selected column (i.e., COL_WORD) of the array. Thereafter, appropriate bitline voltages develop on the COL_RBL ports 316 which are connected to the ROW_RBL ports via the common read nodes in the diagonally-placed P-cells. Accordingly, data is sensed in the same I/O block and provided as output on DATA_OUT lines 524.

Based on the foregoing, it should be appreciated that the present invention provides an innovative row/column accessible memory circuit that advantageously overcomes the shortcomings and deficiencies of the state-of-the-art solutions. A built-in multiplex functionality is achieved by the operation of column read and write transistors and coupling the row read/write ports with the column read/write ports via common nodes in the diagonal P-cells. Consequently, by eliminating the need for a separate column I/O block and associated MUX circuitry, significant savings in the silicon area can be realized. Moreover, because additional metal routing is no longer necessary, defect-prone geometry is accordingly minimized, which increases manufacturability of the row/column accessible memory circuit of the present invention.

It is believed that the operation and construction of the present invention will be apparent from the foregoing Detailed Description. While the method and circuitry shown and described have been characterized as being preferred, it should be readily understood that various changes and modifications could be made therein without departing from the scope of the present invention as set forth in the following claims. For example, although SRAM-based memory has been particularly described in greater detail, it should be recognized that the teachings of the present invention may also be practiced with other types of memories such as DRAMs, EPROMs, Flash memory, et cetera. Additionally, different types of SRAM cells may be utilized in the row/column accessible memory of the present invention.

Further, although the presently preferred exemplary core cells and P-cells include an inverter disposed between one of the data nodes and a read transistor (either row read transistor or column read transistor), it should be apparent that such an inverter is unnecessary for purposes of the present invention. Moreover, while the use of single-ended SA circuitry is exemplified for illustrating the teachings of the present invention, such SA circuitry is not restrictive or limiting. That is, all known and heretofore unknown SA circuits (e.g., differential SAs, et cetera) can be used in conjunction with the row/column accessible memory array set forth herein. Accordingly, it should be appreciated that these and other modifications, deletions, additions, substitutions, combinations, changes, etc. are deemed to be within the ambit of the present invention whose scope is defined solely by the claims set forth immediately hereinbelow.

What is claimed is:

1. A memory circuit, comprising:

a plurality of memory cells organized into an array of N rows and N columns, said array having a first diagonal portion and a second diagonal portion;

a control logic block operable with an access control signal to effectuate one of a row access operation and a column access operation;

each memory cell having first and second read ports and first and second write ports, said first read and write ports being operable with respect to said row access operation and said second read and write ports being operable with respect to said column access operation, wherein said first and second read ports are tied together and said first and second write ports are tied together for each diagonally placed memory cell in one of said first and second diagonal portions of said array;

a decoder circuit block for generating at least one a horizontal wordline select signal and a vertical wordline select signal responsive to a plurality of address signals and a control signal provided by said control logic block, said horizontal wordline select signal for selecting a particular horizontal word with respect to said row access operation and said vertical wordline select signal for selecting a particular vertical word of said array for said column access operation; and an input/output (I/O) block common for said row and column access operations for effectuating data input for a write operation and data output for a read operation.

2. The memory circuit as set forth in claim 1, wherein each of said plurality of memory cells comprises:

a pair of inverters coupled to each other to form a first data node and a second data node for storing complementary binary data thereat;

a row write transistor coupled to said first data node, said row write transistor operating to provide a data value available at said first write port to said first data node when activated by a row write wordline select signal generated by said decoder circuit;

a row read transistor coupled to said second data node, said row read transistor operating to provide a data value available at said second data node to said first read port when activated by a row read wordline select signal generated by said decoder circuit;

a column write transistor coupled to said first data node, said column write transistor operating to provide a data value available at said second write port to said first data node when activated by a column write wordline select signal generated by said decoder circuit; and a column read transistor coupled to said second data node, said column read transistor operating to provide a data value available at said second data node to said second read port when activated by a column read wordline select signal generated by said decoder circuit.

3. The memory circuit as set forth in claim 2, wherein each of said row and column read transistors is coupled to said second data node through an inverter disposed therebetween.

4. The memory circuit as set forth in claim 2, wherein each of said row and column write transistors and said row and column read transistors is an NMOS device.

5. A special memory cell structure for use in a row and column accessible memory device, wherein a plurality of said programmed memory cells form a diagonal portion of an array associated with said memory device, comprising:

a first pair of read and write ports operable with respect to a row access operation and a second pair of read and write ports operable with respect to a column access operation in response to an access control signal;

a pair of inverters coupled to each other to form a first data node and a second data node for storing complementary binary data thereat;

a row write transistor coupled to said first data node, said row write transistor operating to provide a data value available at said first write port to said first data node when activated by a row write wordline select signal generated by a decoder circuit disposed in said row and column accessible memory device;

a row read transistor coupled to said second data node, said row read transistor operating to provide a data value available at said second data node to said first read port when activated by a row read wordline select signal generated by said decoder circuit;

a column write transistor coupled to said first data node, said column write transistor operating to provide a data value available at said second write port to said first data node when activated by a column write wordline select signal generated by said decoder circuit;

a column read transistor coupled to said second data node, said column read transistor operating to provide a data value available at said second data node to said second read port when activated by a column read wordline select signal generated by said decoder circuit; and a common write node that ties together said first and second write ports and a common read node that ties together said first and second read ports.

6. The special memory cell structure for use in a row and column accessible memory device as set forth in claim 5, wherein each of said row and column read transistors is coupled to said second data node through an inverter disposed therebetween.

7. The special memory cell structure for use in a row and column accessible memory device as set forth in claim 5, wherein each of said row and column write transistors and said row and column read transistors is an NMOS device.

8. A memory read operation in a row and column accessible memory array organized as N rows by N columns, comprising the steps of:

asserting a clock signal and an access control signal to initiate a memory read cycle in one of a row access operation and a column access operation based on a plurality of address signals supplied to a control block coupled to said memory array;

if said row access operation is specified, generating a row read wordline select signal for a selected row of said memory array;

developing a row read bitline signal associated with a particular memory cell disposed on said selected row in response to said row read wordline select signal;

sensing data on said row read bitline signal in an input/output (I/O) block coupled to said memory array and outputting said data on an appropriate data-out line associated with said I/O block;

if said column access operation is specified, generating a column read wordline select signal for a selected column of said memory array;

developing a column read bitline signal associated with a particular memory cell disposed on said selected column in response to said column read wordline select signal; and sensing data on said column read bitline signal in said I/O block coupled to said memory array and outputting said data on an appropriate data-out line associated with said I/O block.

9. The memory read operation in a row and column accessible memory array as set forth in claim 8, wherein each of said particular memory cells is comprised of an SRAM cell.

10. The memory read operation in a row and column accessible memory array as set forth in claim 8, wherein each of said particular memory cells is comprised of an EPROM cell.

11. The memory read operation in a row and column accessible memory array as set forth in claim 8, wherein each of said particular memory cells is comprised of a Flash memory cell.

12. The memory read operation in a row and column accessible memory array as set forth in claim 8, wherein each of said particular memory cells is comprised of a DRAM cell.

13. A memory write operation in a row and column accessible memory array organized as N rows by N columns, comprising the steps of:

asserting a clock signal and an access control signal to initiate a memory write cycle in one of a row access operation and a column access operation based on a plurality of address signals supplied to a control block coupled to said memory array;

if said row access operation is specified, generating a row write wordline select signal for a selected row of said memory array;

generating a row write bitline signal associated with a particular memory cell disposed on said selected row in response to a data value available via a data input line through an Input/Output (I/O) block associated with said memory array;

storing said data value associated with said row write bitline signal at a data node in said particular memory cell in said selected row;

if said column access operation is specified, generating a column write wordline select signal for a selected column of said memory array;

generating a column write bitline signal associated with a particular memory cell disposed on said selected column in response to a data value available via a data input line through said I/O block associated with said memory array; and storing said data value associated with said column write bitline signal at a data node in said particular memory cell in said selected column.

14. The memory write operation in a row and column accessible memory array as set forth in claim 13, wherein each of said particular memory cells is comprised of a DRAM cell.

15. The memory write operation in a row and column accessible memory array as set forth in claim 13, wherein each of said particular memory cells is comprised of an SRAM cell.

16. The memory write operation in a row and column accessible memory array as set forth in claim 13, wherein each of said particular memory cells is comprised of an EPROM cell.

17. The memory write operation in a row and column accessible memory array as set forth in claim 13, wherein each of said particular memory cells is comprised of a Flash memory cell.

* * * * *